United States Patent [19]
Togo

[11] Patent Number: 6,159,809
[45] Date of Patent: Dec. 12, 2000

[54] METHOD FOR MANUFACTURING SURFACE CHANNEL TYPE P-CHANNEL MOS TRANSISTOR WHILE SUPPRESSING P-TYPE IMPURITY PENETRATION

[75] Inventor: Mitsuhiro Togo, Tokyo, Japan

[73] Assignee: NEC Corporation, Tokyo, Japan

[21] Appl. No.: 08/882,647

[22] Filed: Jun. 25, 1997

[30] Foreign Application Priority Data

Jun. 27, 1996 [JP] Japan .................................. 8-167284

[51] Int. Cl.[7] .............................................. H01L 21/336
[52] U.S. Cl. ......................... 438/301; 438/532; 438/923
[58] Field of Search .................................. 438/301, 923, 438/519, 532; 257/407

[56] References Cited

U.S. PATENT DOCUMENTS 5,393,676 2/1995 Anjum et al. .
5,464,792 11/1995 Tseng et al. .

FOREIGN PATENT DOCUMENTS 60-42865 3/1985 Japan .
4-6870 1/1992 Japan .

OTHER PUBLICATIONS

Y.H. Lin, C.S. Lai, C.L. Lee, T.F. Lei, T.S. Chao. Nitridization of the Stacked Poly–Si Gate to Suppress the Boron Penetration in pMOS. IEEE Electron Device Letters, Vo. 16 No. 6, Jun. 1995. P. 248–249.

W.T. Sun, S.H. Chen, C.J. Lin, T.S. Chao, C.C.–H Hsu. Process Optimization for Preventing Boron–Penetration Using P or As Co–Implant in P–Poly Gate of P–MOSFETs. 1995 International Symposium on VLSI Technology, Systems, and Applications. Jun. 1995 P. 40–43.

Second Office Action of Japanese Application No. 8–167284 Issued on Oct. 6, 1998.

European Patent Office; Patent Abstracts of Japan; Publication Number: 02078229; Publication Date: Mar. 19, 1990; Title: Field–Effect Transistor and it's Manufacture.

Extended Abstracts of the 1995 International Conference; Title: Impact of Nitrogen Implantation on Highly Reliable Sub–Quarter Micron LDD MOSFETs; Author: Shimizu et al.; Date: Aug. 21, 1995.

European Search Report; Date: Mar. 27, 1998.

*Primary Examiner*—Olik Chaudhuri
*Assistant Examiner*—Ginette Peralta Montás
*Attorney, Agent, or Firm*—Laff, Whitesel & Saret, Ltd.; J. Warren Whitesel

[57] ABSTRACT

In a method for manufacturing a surface channel type P-channel MOS transistor, a gate insulating layer is formed on a semiconductor substrate, and a gate electrode is formed on the gate insulating layer. Then, a P-type impurity diffusion preventing operation is performed upon the gate electrode, and P-type impurities are implanted into the gate electrode.

3 Claims, 21 Drawing Sheets

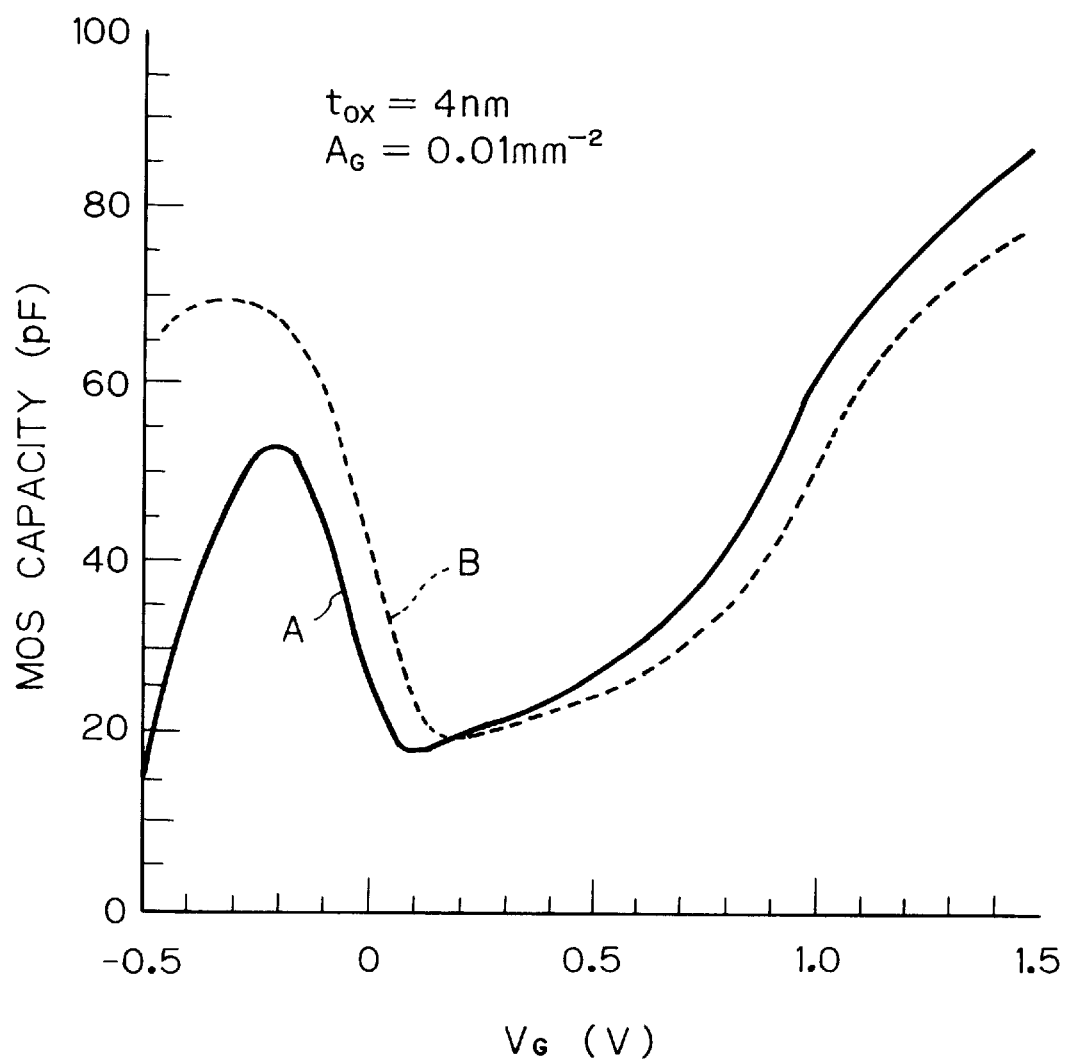

METHOD FOR MANUFACTURING SURFACE CHANNEL TYPE P-CHANNEL MOS TRANSISTOR WHILE SUPPRESSING P-TYPE IMPURITY PENETRATION

BACKGROUND OF THE INVENTION

1. Field of the Invention

The present invention relates to a method for manufacturing a surface channel type P-channel MOS transistor.

2. Description of the Related Art

Generally, in a complementary MOS (CMOS) device, if a gate electrode of a P-channel MOS transistor as well as a gate electrode of an N-channel MOS transistor is of an N-type, the P-channel MOS transistor is of a buried channel type while the N-channel MOS transistor is of a surface channel type. In the buried channel type transistor, carriers flow deeper than an interface between a gate insulating layer and a semiconductor substrate (well). Therefore, the buried channel type transistor is not subjected to the surface scattering, and the mobility of carriers is relatively large. However, the burled channel type transistor is disadvantageous in terms of a punch through phenomenon, so that the channel length cannot be reduced.

In view of the foregoing, surface channel type P-channel MOS transistor are also adopted in CMOS devices.

In a first prior art method, after a gate electrode of boron-included polycrystalline silicon is formed on a gate silicon oxide layer, an annealing operation is carried out to activate impurity ions of source/drain regions. This will be explained later in detail.

In the first prior art method, however, during the above-mentioned annealing operation, the borons of the gate electrode easily penetrate the gate silicon oxide layer to reach the well (substrate). This is called a "boron penetration phenomenon". As a result, the threshold voltage of the transistor greatly fluctuates.

In a second prior art method, a gate insulating layer is made of silicon nitride. The penetration of borons in the gate electrode into the well (the substrate) can be suppressed by the gate silicon nitride layer. This will also be explained later in detail.

In the second prior art method, however, when the gate silicon nitride layer is very thin, it is impossible to control the thickness of the gate silicon nitride layer. It is also difficult to control the concentration of nitrogen in the nitrogen annealing operation, which makes the control of the nitrogen annealing operation complex, thus increasing the manufacturing cost.

In a third prior art method, nitrogen ions are implanted into a gate electrode (see S. Shimizu et al., "0.15 μm CMOS Process for High Performance and Reliability", International Electron Device Meeting (IEDM), pp. 67–70, 1994). Thus, the penetration of borons in the gate electrode into the well (the substrate) can be suppressed by the nitrogen included in the gate electrode. This will also be explained later in detail.

In the third prior art method, however, the number of manufacturing steps is increased which increases the manufacturing cost. In addition, the high concentration of nitrogen in the gate electrode harms homogenous distribution of borons in the gate electrode.

SUMMARY OF THE INVENTION

It is an object of the present invention to provide a method for manufacturing a surface channel type P-channel MOS transistor capable of suppressing a boron penetration phenomenon and reducing the thickness of a gate insulating layer without increasing the manufacturing cost.

According to the present invention, in a method for manufacturing a surface channel type P-channel MOS transistor, a gate insulating layer is formed on a semiconductor substrate, and a gate electrode is formed on the gate insulating layer. Then, a P-type impurity diffusion preventing operation is performed upon the gate electrode, and P-type impurities are implanted into the gate electrode.

Thus, since the thermal diffusion of the P-type impurities within the gate electrode is suppressed, the penetration of the P-type impurities into the semiconductor substrate can be suppressed.

BRIEF DESCRIPTION OF THE DRAWINGS

The present invention will be more clearly understood from the description set forth below, as compared with the prior art with reference to the accompanying drawings, wherein:

FIG. 7 is a graph showing a MOS capacity of the transistor of FIGS. 5A through 5D;

DESCRIPTION OF THE PREFERRED EMBODIMENTS

Before the description of the preferred embodiments, prior art methods for manufacturing a surface channel type P-channel MOS transistor will be explained with reference to FIGS. 1A through 1D, 2, 3A through 3F, and 4A through 4F.

FIGS. 1A through 1D show a first prior art method.

Figure 1A:
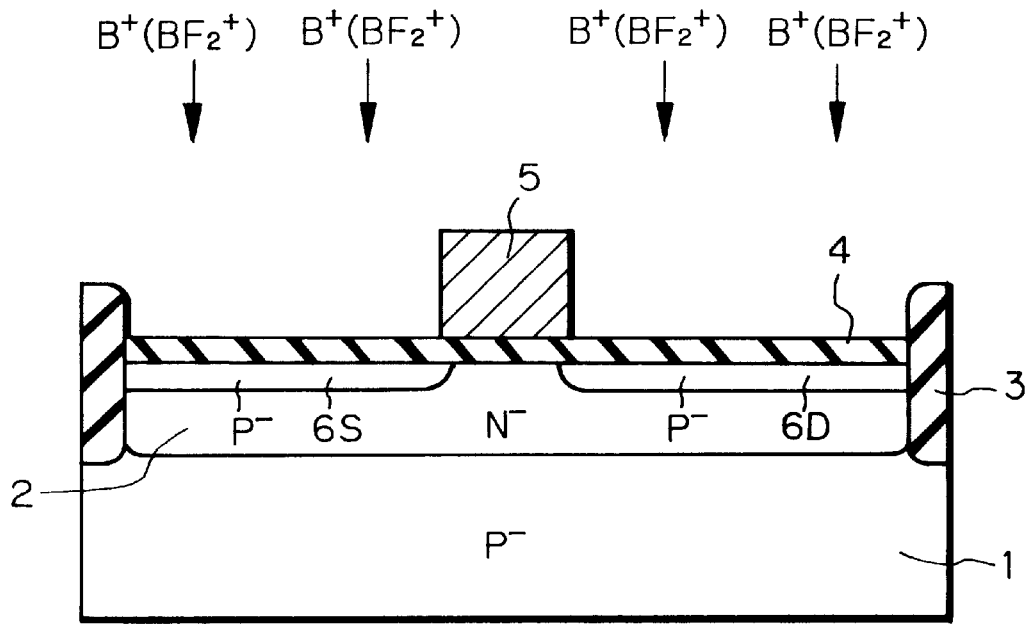
FIGS. 1A through 1D are cross-sectional views for showing a first prior art method for manufacturing a surface channel type P-channel MOS transistor.

First, referring to FIG. 1A, an $N^-$-type well 2 is formed on a $P^-$-type monocrystalline silicon substrate 1. Then, a thick field silicon oxide layer 3 is grown by a local oxidation of silicon (LOCOS) process to partition an area forming a surface channel type P-channel MOS transistor and other areas for forming a surface channel type N-channel MOS transistor or the like (not shown). Then, a gate silicon oxide layer 4 is grown by thermally oxidizing the N⁻-type well 2. Then, a polycrystalline silicon layer is deposited by a chemical vapor deposition (CVD) process, and the polycrystalline silicon layer is patterned by a photolithography process to form a gate electrode 5. Then, boron (B) ions or boron fluoride (BF₂) ions are implanted into the N-type well 2 to form P⁻-type impurity regions 6S and 6D which serve as low impurity regions of a lightly-doped drain (LDD) structure.

Figure 1B:
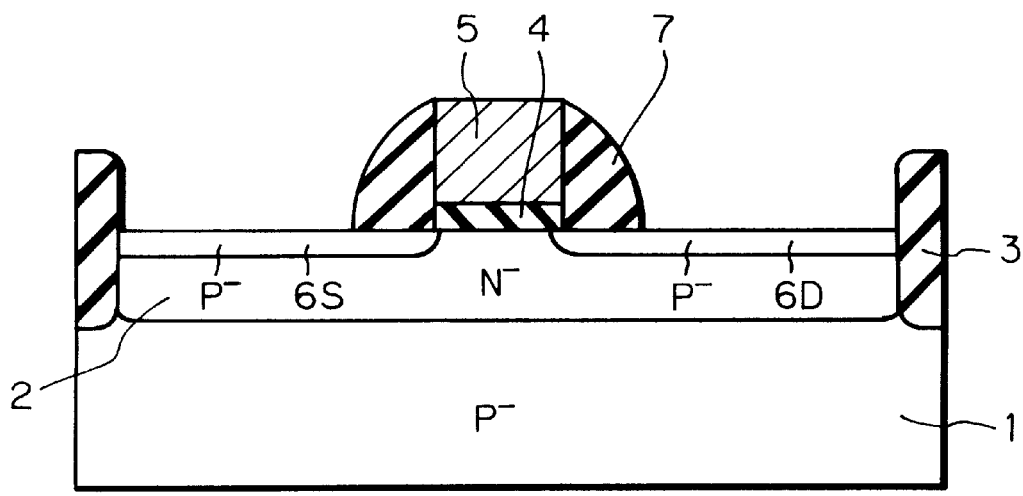

Next, referring to FIG. 1B, the gate silicon oxide layer 4 is etched by using the gate electrode 5 as a mask. Then, a sidewall silicon oxide layer 7 is formed on the sidewall of the gate electrode 5.

Figure 1C:
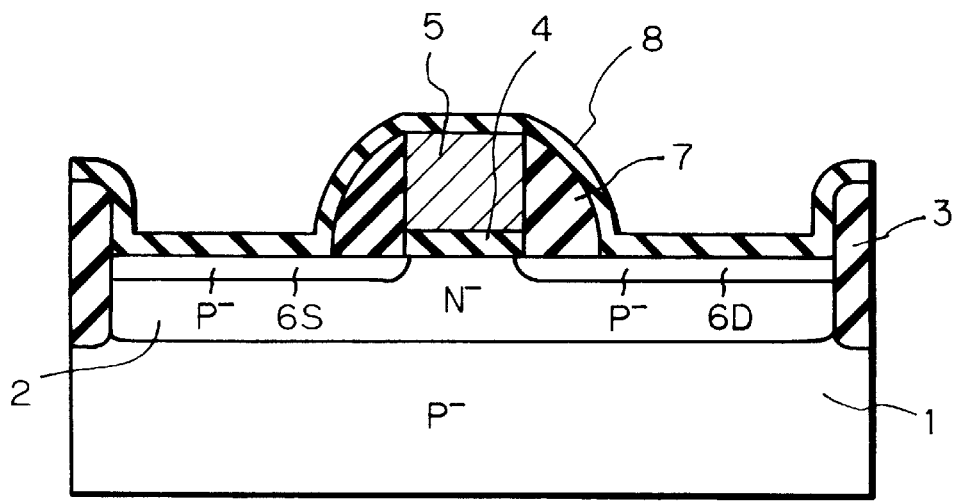

Next, referring to FIG. 1C, a silicon oxide layer 8 is deposited on the entire surface by a CVD process.

Figure 1D:
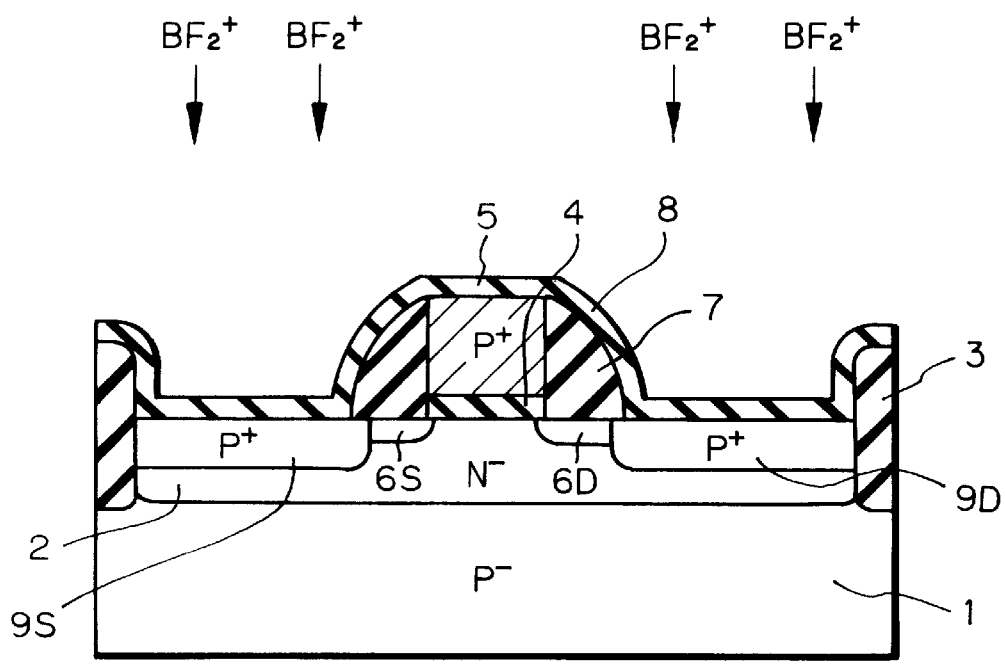

Finally, referring to FIG. 1D, boron (B) ions or boron fluoride (EF₂) ions are implanted into the N⁻-type well 2 by using the gate electrode 5 and the sidewall silicon oxide layer 7 as a mask to form P⁻-type impurity regions 9S and 9D which serve as high impurity regions of the LDD structure. Then, an annealing operation is carried out to activate the implanted impurities. Then, an insulating layer (not shown) is formed on the entire surface, and contact structures (not shown) are formed therein to complete a P-channel MOS transistor.

Since the gate electrode 5 is of a P⁺-type including borons, the P-channel MOS transistor is of a surface channel type, which is advantageous in terms of the short channel effect.

In the surface channel type P-channel MOS transistor obtained by the method as illustrated in FIGS. 1A through 1D, however, during the above-mentioned annealing operation, the borons of the gate electrode 4 easily penetrate the gate silicon oxide layer 4 to reach the N-type well 2 and the substrate 1. This is called "boron penetration phenomenon". As a result, the threshold voltage of the transistor greatly fluctuates. That is, as shown in FIG. 2, when the temperature of the annealing operation is increased, the boron of the gate electrode 5 penetrates into the N⁻-type well 2 (the substrate 1), so that the MOS capacity of the transistor greatly fluctuates, which means a large fluctuation of the threshold voltage of the transistor.

Figure 2:
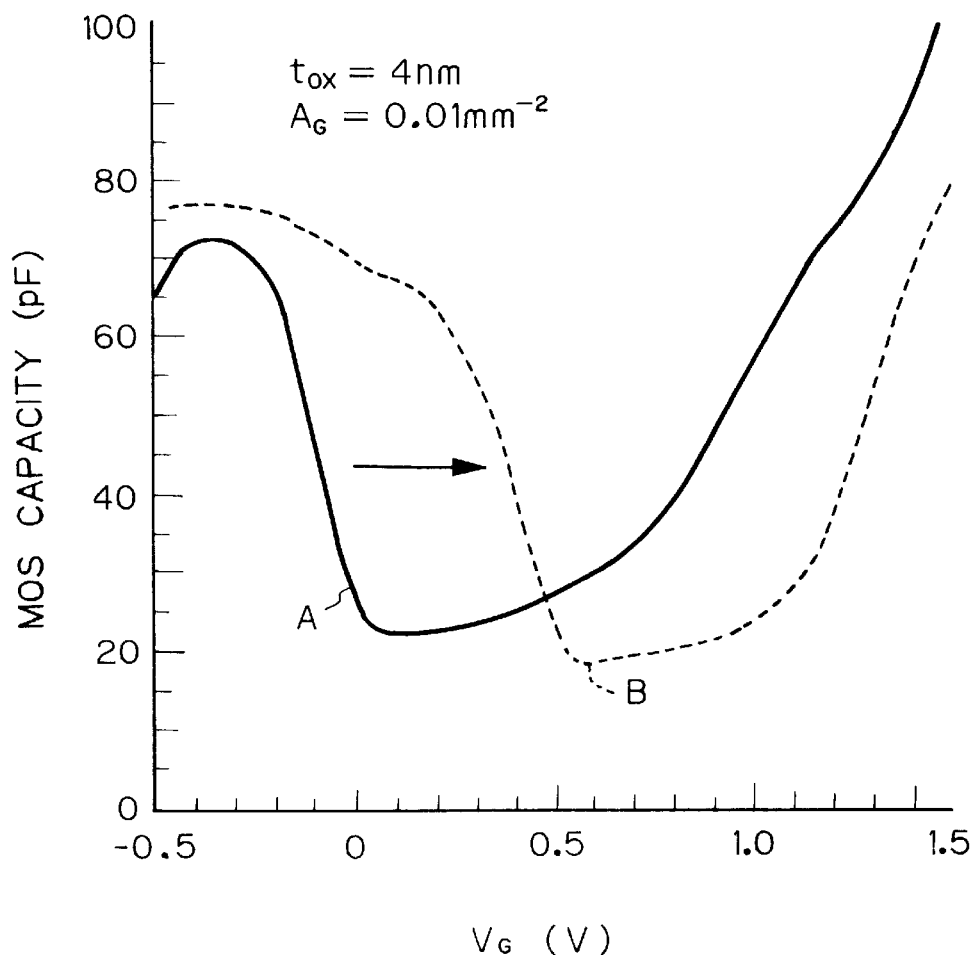
FIG. 2 is a graph showing a MOS capacity of the transistor of FIGS. 1A through 1D.

In FIG. 2, note that $V_G$ is a gate voltage, $t_{ox}$ is a thickness of the gate silicon oxide layer 4, $A_G$ is an area of the gate electrode 5, a solid line shows a case where the annealing operation is carried out at 800° C. for 10 minutes, and a dotted line shows a case where the annealing operation is carried out at 900° C. for 10 minutes.

Particularly, when the boron implantation is carried out by using boron fluoride (BF₂) ions, not boron (B) ions, the boron penetration phenomenon is notable. Note that BF₂ ions rather than B ions reduces the junction depth which suppresses the short channel effect in a P-channel transistor having a gate length of less than 0.35 μm.

FIGS. 3A through 3F show a second prior art method.

Figure 3A:
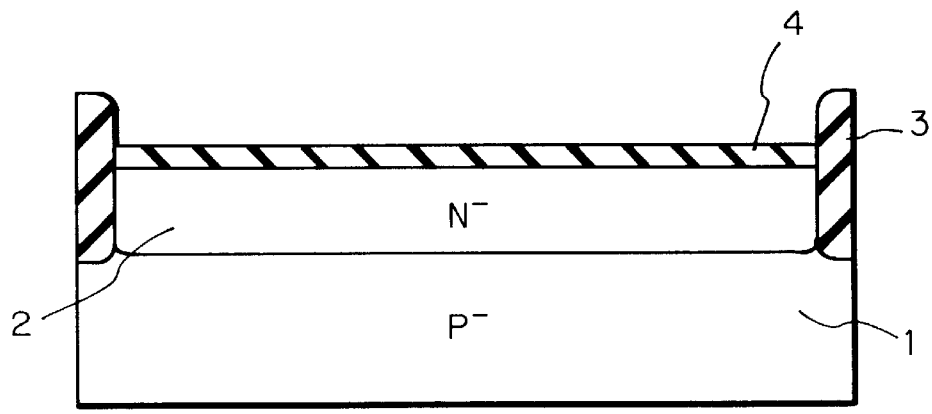
FIGS. 3A through 3F are cross-sectional views for showing a second prior art method for manufacturing a surface channel type P-channel MOS transistor.

First, referring to FIG. 3A, an N⁻-type well 2 is formed on a P⁻-type monocrystalline silicon substrate 1. Then, a thick field silicon oxide layer 3 is grown by a LOCOS process to partition an area forming a surface channel type P-channel MOS transistor and other areas for forming a surface channel type N-channel MOS transistor or the like (not shown). Then, a gate silicon oxide layer 4 is grown by thermally oxidizing the N⁻-type well 2.

Figure 3B:
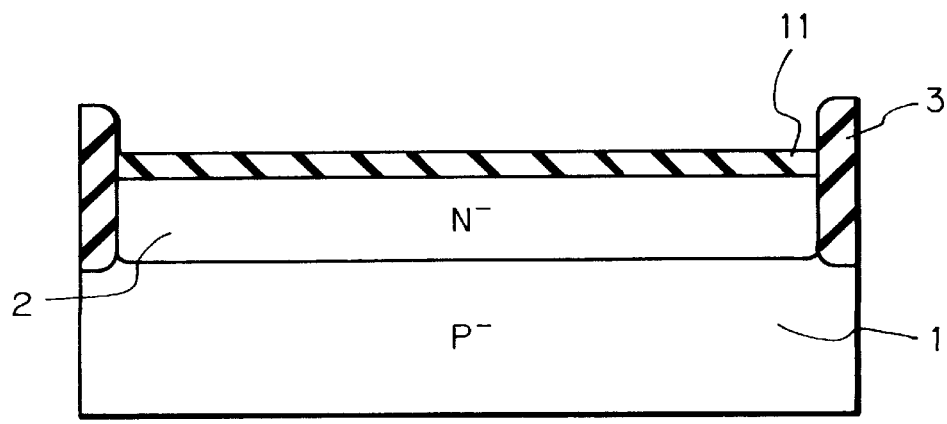

Next, referring to FIG. 3B, the gate silicon oxide layer 4 is converted into a silicon nitride layer 11 by performing a nitrogen annealing operation upon the device.

Figure 3C:
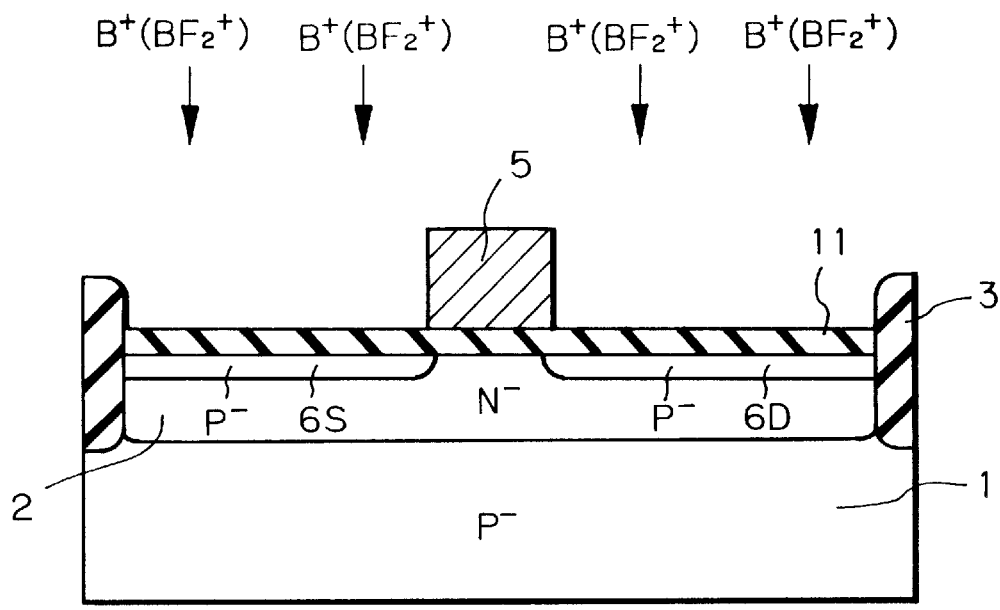

Next, referring to FIG. 3C, a polycrystalline silicon layer is deposited by a CVD process, and the polycrystalline silicon layer is patterned by a photolithography process to form a gate electrode 5. Then, boron (B) ions or boron fluoride (BF₂) ions are implanted into the N-type well 2 to form P⁻-type impurity regions 6S and 6D which serve as low impurity regions of an LDD structure.

Figure 3D:
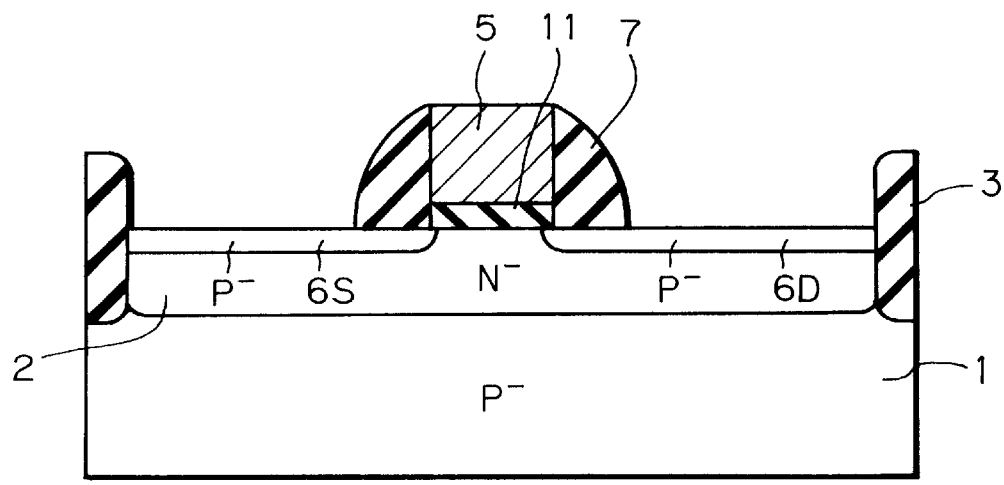

Next, referring to FIG. 3D, in the same way as in FIG. 1B, the gate silicon nitride layer 11 is etched by using the gate electrode 5 as a mask. Then, a sidewall silicon oxide layer 7 is formed on the sidewall of the gate electrode 5.

Figure 3E:
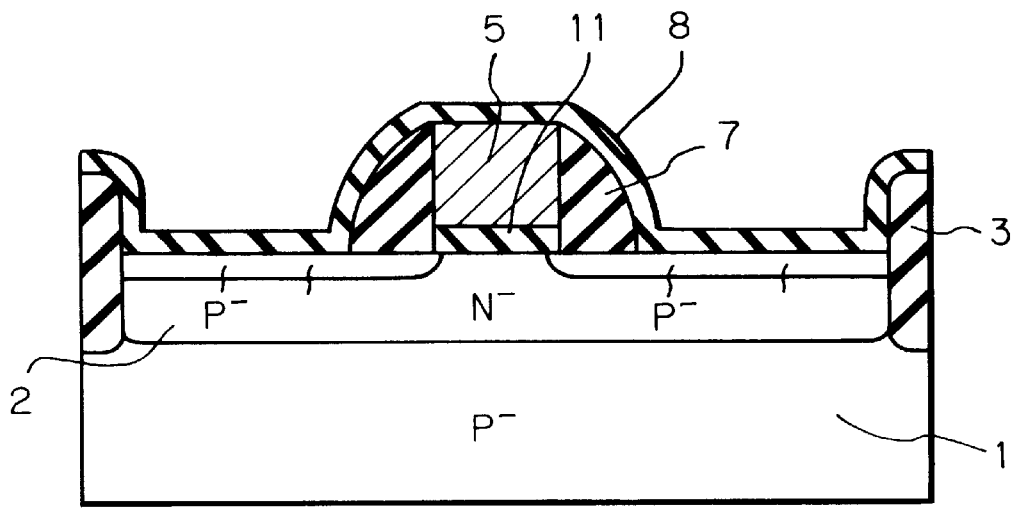

Next, referring to FIG. 3E, in the same way as in FIG. 1C, a silicon oxide layer 8 is deposited on the entire surface by a CVD process.

Figure 3F:
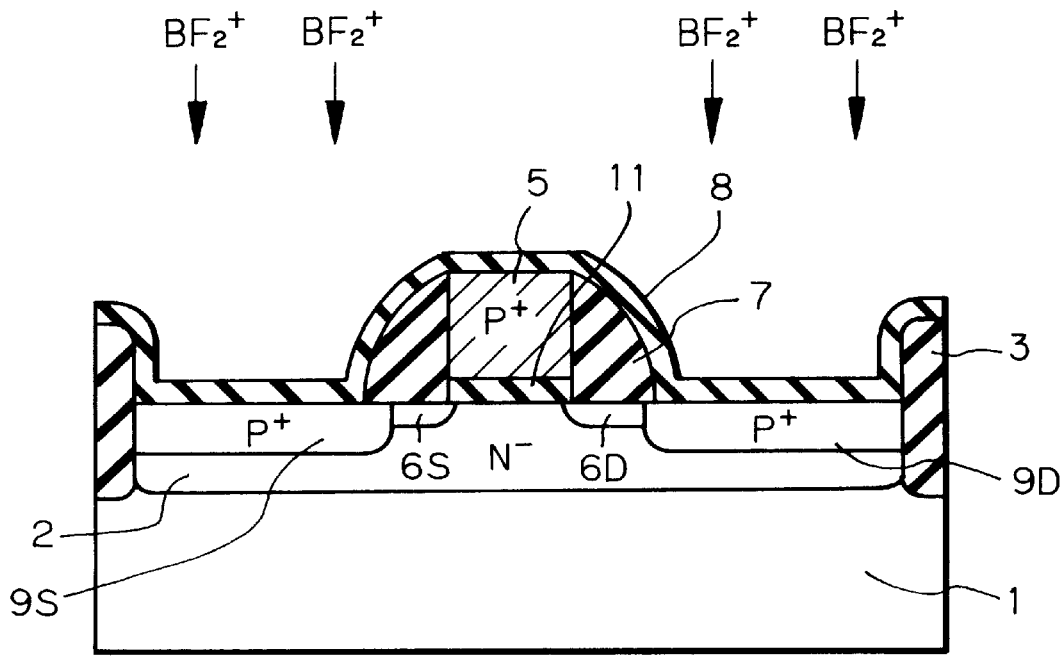

Finally, referring to FIG. 3F, in the same way as in FIG. 1D, boron (B) ions or boron fluoride (BF₂) ions are implanted into the N⁻-type well 2 by using the gate electrode 5 and the sidewall silicon oxide layer 7 as a mask to form P⁺-type impurity regions 9S and 9D which serve as high impurity regions of the LDD structure. Then, an annealing operation is carried out to activate the implanted impurities. Then, an insulating layer (not shown) is formed on the entire surface, and contact structures (not shown) are formed therein to complete a surface channel type P-channel MOS transistor.

Thus, the penetration of borons in the gate electrode 5 to the N⁻-type well 2 (the substrate 1) can be suppressed by the gate silicon nitride layer 11.

The surface channel P-channel MOS transistor is obtained by the method as illustrated in FIGS. 3A through 3F; however, when the gate silicon nitride layer 11 is very thin, it is impossible to control the thickness of the gate silicon nitride layer 11. For example, if the gate length is less than 0.35 μm, the thickness of the gate silicon nitride layer 11 is less than 7 nm, so that it is impossible to control the thickness of the gate silicon nitride layer 11. Also, if the concentration of nitrogen in the nitrogen annealing operation is too high, lattice defects may be generated in the N⁻-type well 2 (the substrate 1). Contrary to this, if the concentration of nitrogen in the nitrogen annealing operation is too low, a Si/SiO₂ interface remains which degrades the performance of the transistor. Thus, it is also difficult to control the concentration of nitrogen in the nitrogen annealing operation, which makes the control of the nitrogen annealing operation complex, thus increasing the manufacturing cost.

FIGS. 4A through 4F show a third prior art method (see S. Shimizu et al., "0.15 μm CMOS Process for High Performance and Reliability", International Electron Devices Meeting (IEDM), pp. 67–70, 1994).

Figure 4A:
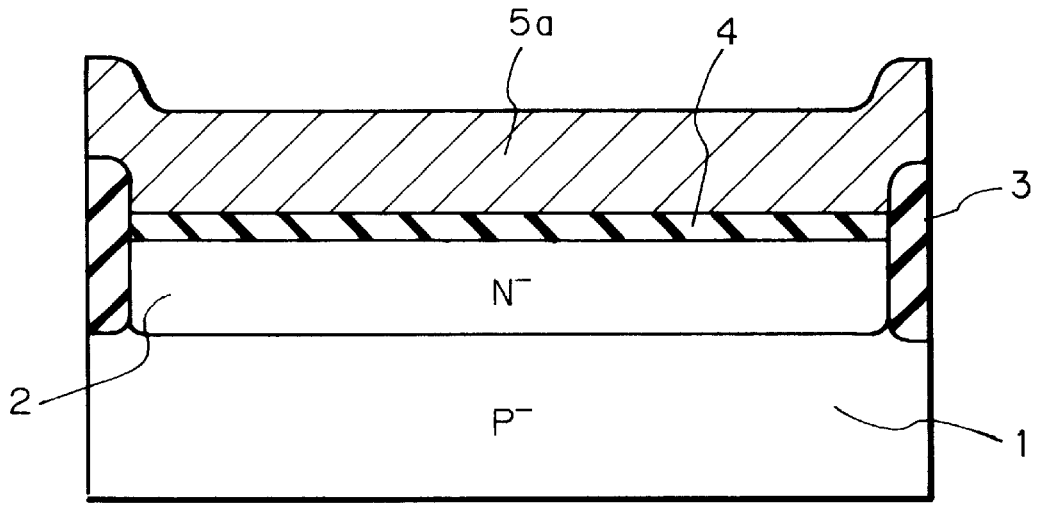
FIGS. 4A through 4F are cross-sectional views for showing a third prior art method for manufacturing a surface channel type P-channel MOS transistor.

First, referring to FIG. 4A, in a similar way to that of FIG. 1A, an N⁻-type well 2 is formed on a P⁻-type monocrystalline silicon substrate 1. Then, a thick field silicon oxide layer 3 is grown by a LOCOS process to partition an area forming a surface channel type P-channel MOS transistor and other areas for forming a surface channel type N-channel MOS transistor or the like (not shown). Then, a gate silicon oxide layer 4 is grown by thermally oxidizing the N⁻-type well 2. Then, a polycrystalline silicon layer 5a is deposited by a CVD process.

Figure 4B:
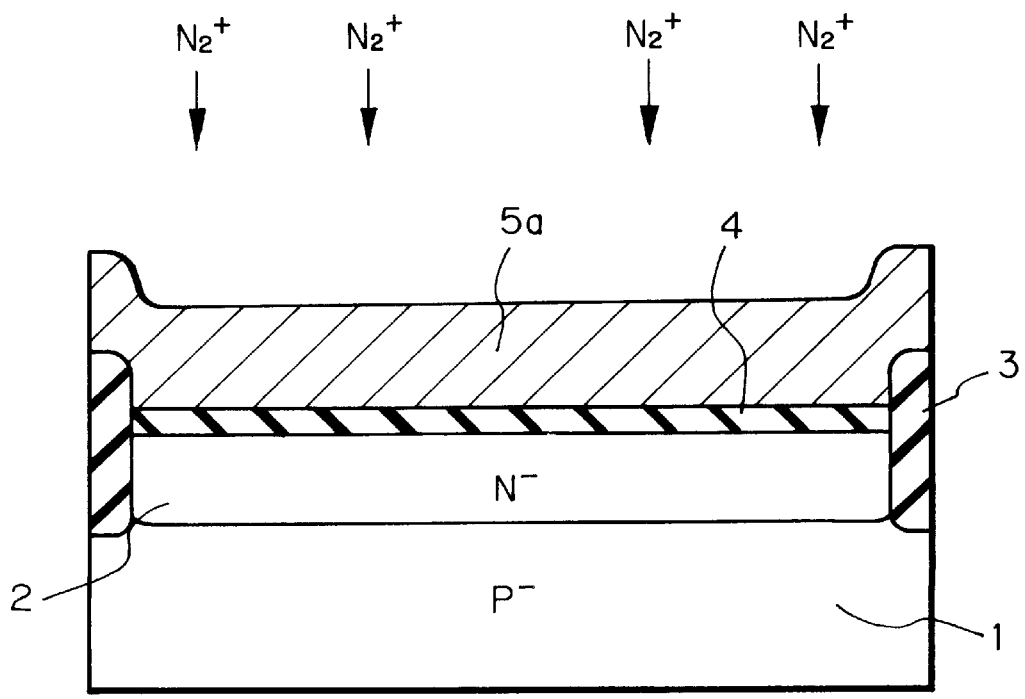

Next, referring to FIG. 4B, nitrogen ions are implanted into the polycrystalline silicon layer 5a.

Figure 4C:
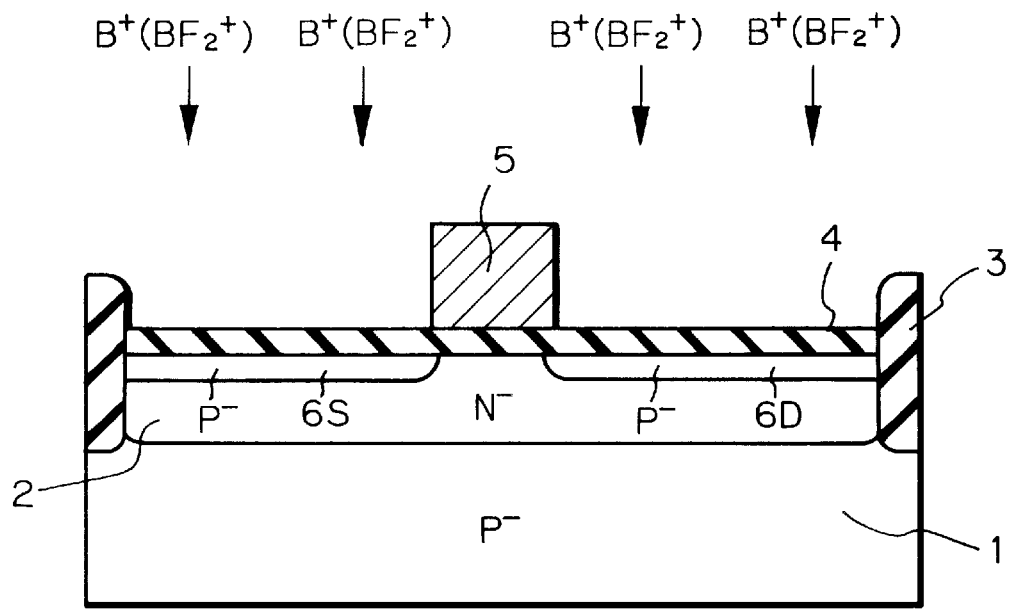

Next, referring to FIG. 4c, the polycrystalline silicon layer 5a is patterned by a photolithography process to form a gate electrode 5. Then, boron (B) ions or boron fluoride ($BF_2$) ions are implanted into the N-type well 2 to form $P^-$-type impurity regions 6S and 6D which serve as low impurity regions of an LDD structure.

Figure 4D:
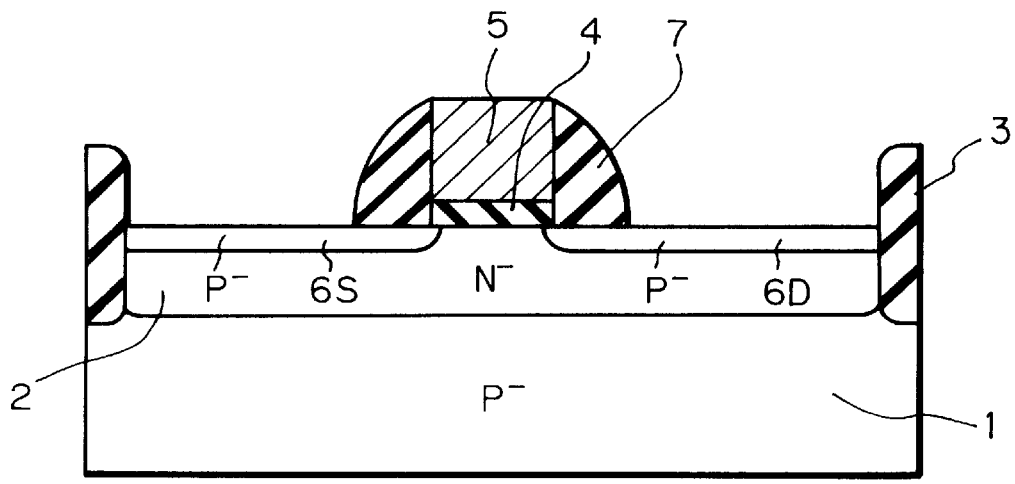

Next, referring to FIG. 4D, in the same way as in FIG. 1B, the gate silicon oxide layer 4 is etched by using the gate electrode 5 as a mask. Then, a sidewall silicon oxide layer 7 is formed on the sidewall of the gate electrode 5.

Figure 4E:
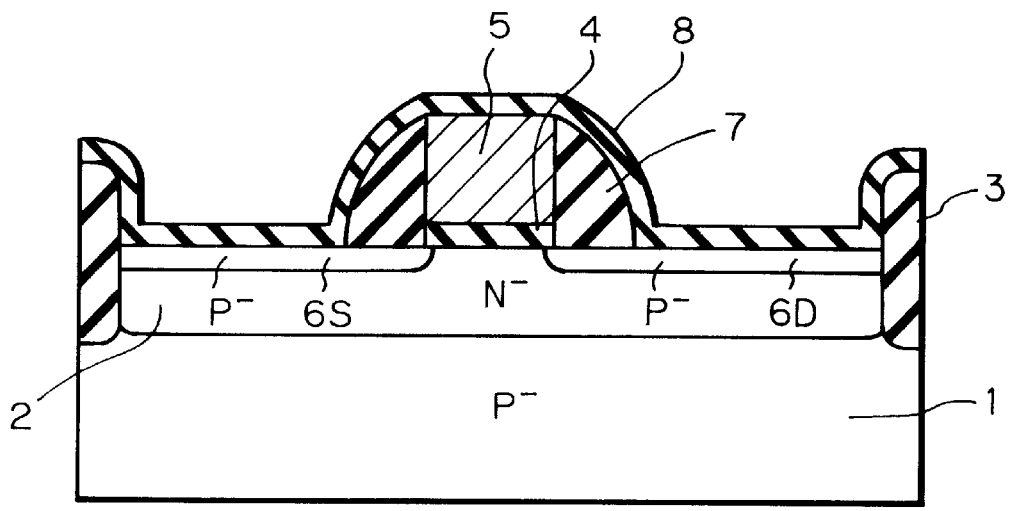

Next, referring to FIG. 4E, in the same way as in FIG. 1C, a silicon oxide layer 8 is deposited on the entire surface by a CVD process.

Figure 4F:
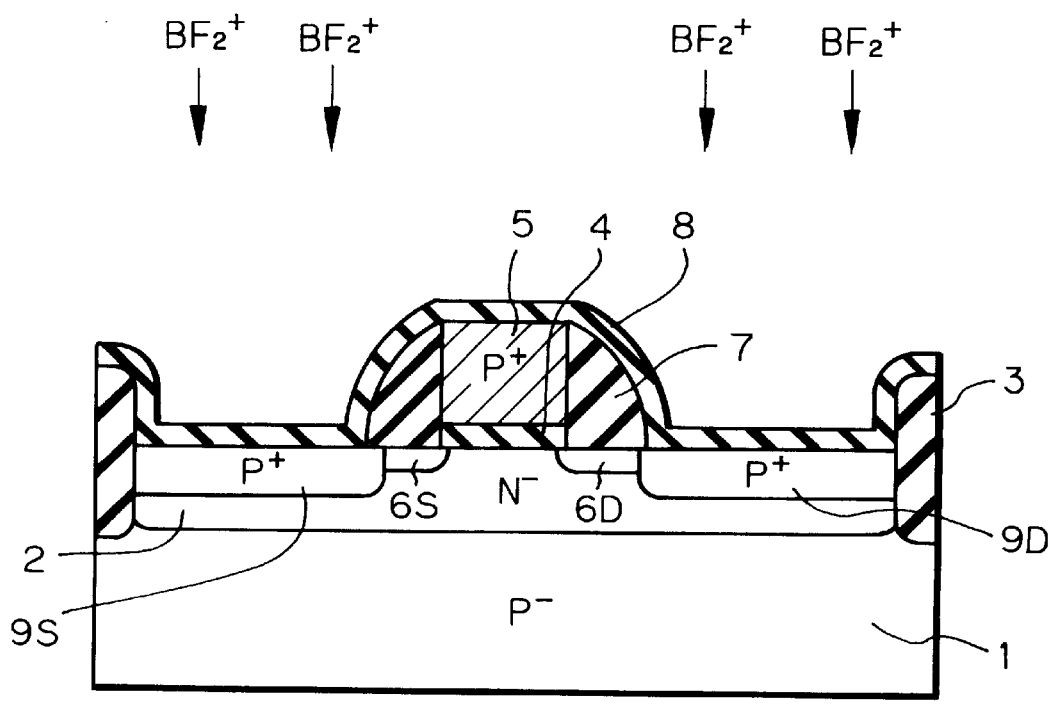

Finally, referring to FIGS. 4F, in the same way as in FIG. 1D, boron (B) ions or boron fluoride ($BF_2$) ions are implanted into the $N^-$-type well 2 by using the gate electrode 5 and the sidewall silicon oxide layer 7 as a mask to form $P^+$-type impurity regions 9S and 9D which serve as high impurity regions of the LDD structure. Then, an annealing operation is carried out to activate the implanted impurities. Then, an insulating layer (not shown) is formed on the entire surface, and contact structures (not shown) are formed therein to complete a surface channel type P-channel MOS transistor.

Thus, the penetration of borons in the gate electrode 5 to the $N^-$-type well 2 (the substrate 1) can be suppressed by the nitrogen included in the gate electrode 5.

In the surface channel P-channel MOS transistor obtained by the method as illustrated in FIGS. 4A through 4F, the number of manufacturing steps is increased which increases the manufacturing cost. In addition, the high concentration of nitrogen in the gate electrode 5 harms homogenous distribution of borons in the gate electrode 5.

FIGS. 5A through 5D show a first embodiment of the present invention.

Figure 5A:
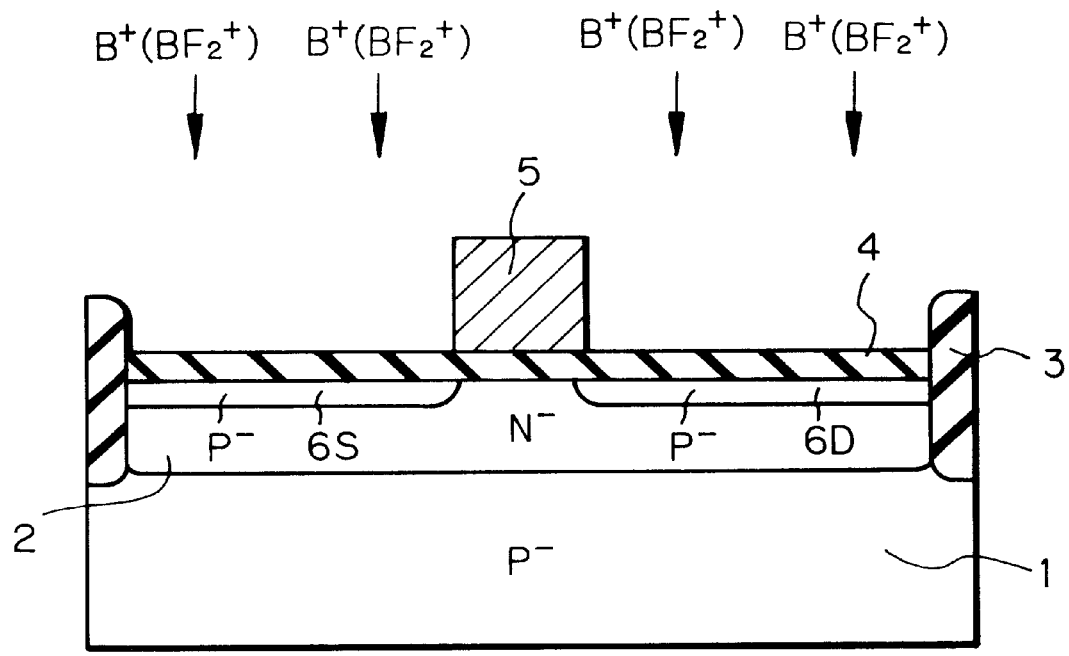
FIGS. 5A through 5D are cross-sectional views for showing a first embodiment of the method for manufacturing a surface channel type P-channel MOS transistor according to the present invention.

First, referring to FIG. 5A, in the same way as in FIG. 1A, an $N^-$-type well 2 is formed on a $P^-$-type monocrystalline silicon substrate 1. Then, a thick field silicon oxide layer 4 is grown by a LOCOS process to partition an area forming a surface channel type P-channel MOS transistor and other areas for forming a surface channel type N-channel MOS transistor or the like (not shown). Then, an about 2 to 7 nm thick gate silicon oxide layer 4 is grown by thermally oxidizing the $N^-$-type well 2. Then, a polycrystalline silicon layer is deposited by a CVD process, and the polycrystalline silicon layer is patterned by a photolithography process to form a gate electrode 5 whose gate length is less than 0.35 $\mu$m. Then, boron (B) ions or boron fluoride ($BF_2$) ions are implanted into the N-type well 2 to form $P^-$-type impurity regions 6S and 6D which serve as low impurity regions of an LDD structure.

Figure 5B:
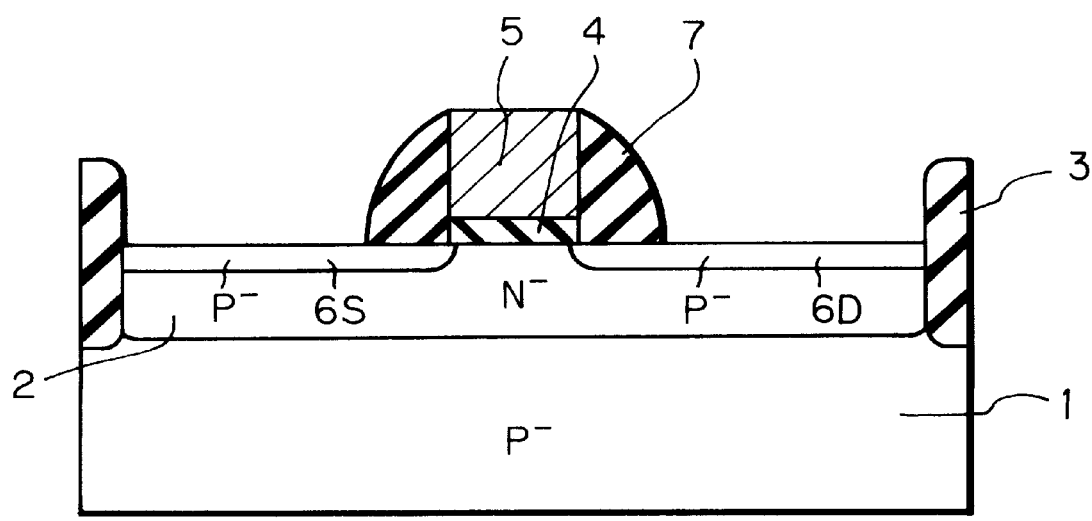

Next, referring to FIG. 5B, in the same way as in FIG. 1B, the gate silicon oxide layer 4 is etched by using the gate electrode 5 as a mask. Then, an about 100 nm thick sidewall silicon oxide layer 7 is formed on the sidewall of the gate electrode 5.

Figure 5C:
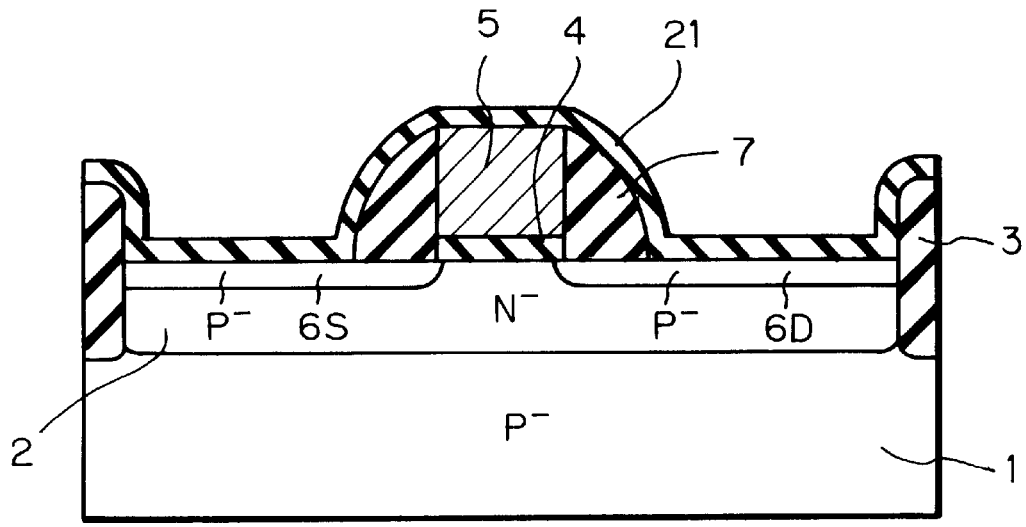

Next, referring to FIG. 5C, an about 20 nm thick nitrogen including layer 21 is deposited on the entire surface by a CVD process. The nitrogen including layer 21 is made of silicon nitride, silicon oxidonitride, boron nitride, or silicon nitride/silicon oxide.

Figure 5D:
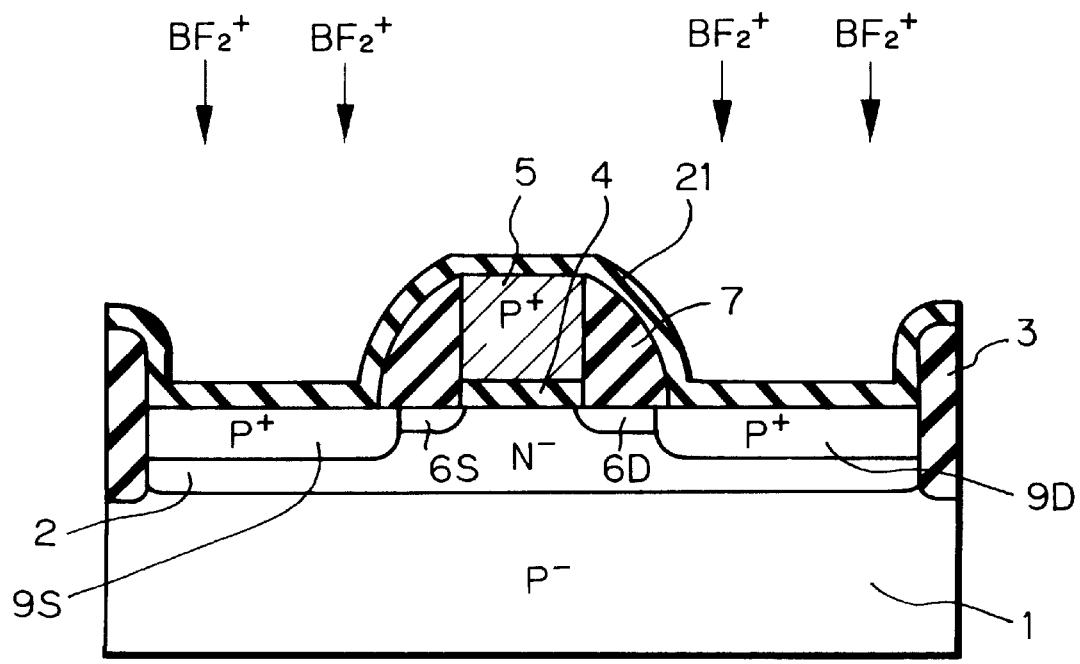

Finally, referring to FIG. 5D, in the same way as in FIG. 1D, about $3\times10^{15}$ boron (B) ions or boron fluoride ($BF_2$) ions per $cm^2$ are implanted at an energy of about 30 KeV into the $N^-$-type well 2 by using the gate electrode 5 and the sidewall silicon oxide layer 7 as a mask to form $P^+$-type impurity regions 9S and 9D which serve as high impurity regions of the LDD structure. Then, an annealing operation is carried out at about 900° C. for about 10 minutes to activate the implanted impurities. Then, an insulating layer (not shown) is formed on the entire surface, and contact structures (not shown) are formed therein to complete a surface channel type P-channel MOS transistor.

In FIG. 5D, when boron ions or boron fluoride ions are implanted into the gate electrode 5, the nitrogen of the nitrogen including layer 21 is also knocked into the gate electrode 5. As a result, the knocked-in nitrogen reacts with the boron in the gate electrode 5, to avoid the diffusion of the boron in the gate electrode 5. Also, the nitrogen of the nitrogen including layer 21 is further knocked into the $N^-$-type well 2 (the substrate 1). As a result, the knocked-in nitrogen reacts with the boron in the $N^-$-type well 2 (the substrate 1) to deactivate the boron in the $N^-$-type well 2 (the substrate 1). Thus, a shallow junction is formed to suppress the short channel effect.

In the first embodiment, if the concentration of borons in the gate electrode 5 is about $3\times10^{20}$ $cm^{-3}$, the concentration of nitrogen in the gate electrode 5 is preferably from $10^{17}$ $cm^{-3}$ to $10^{20}$ $cm^{-3}$. That is, when the concentration of nitrogen in the gate electrode 5 is too low, the suppression of the boron penetration phenomenon cannot be expected. Contrary to this, when the concentration of nitrogen in the gate electrode 5 is too high, nitrogen excessively reacts with boron, which harms the homogeneous distribution of boron in the gate electrode 5.

Figure 6:
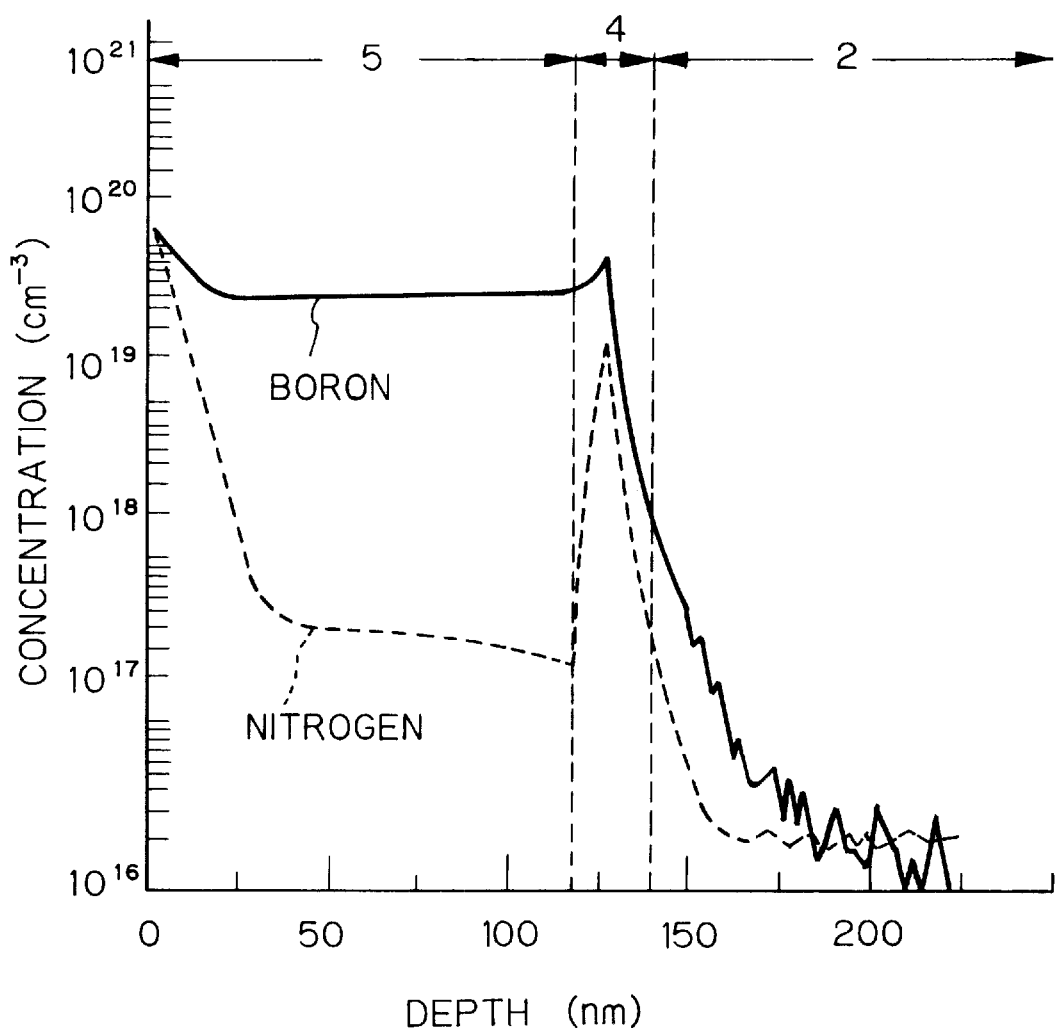
FIG. 6 is a diagram showing concentrations of boron and nitrogen in the gate electrode, the gate silicon oxide layer and the $N^-$-type well (the substrate) of the transistor of FIGS. 5A through 5D.

An experimental example of the distribution of boron and nitrogen using an SIMS analysis in the gate electrode 5, the gate silicon oxide layer 4, and the $N^-$-type well 2 is shown in FIG. 6. That is, the concentration of boron is high at the surface of the gate electrode 5 and within the gate silicon oxide layer 4, and the concentration of nitrogen is relatively low. As a result, the thermal diffusion of boron in the gate electrode 5 is suppressed by the high concentration of nitrogen in the silicon oxide layer 4, to suppress the penetration of boron to the $N^-$-type well 2 (the substrate 1). Also, the distribution of boron in the gate electrode 5 becomes homogeneous.

Thus, as shown in FIG. 7 which corresponds to FIG. 2, even when the temperature of the annealing operation is increased, the boron of the gate electrode 5 hardly penetrates into the $N^-$-type well 2 (the substrate 1), so that the MOS capacity of the transistor hardly fluctuates, which means a small fluctuation of the threshold voltage of the transistor.

FIGS. 8A through 8F show a modification of the first embodiment of the present invention.

Figure 8A:
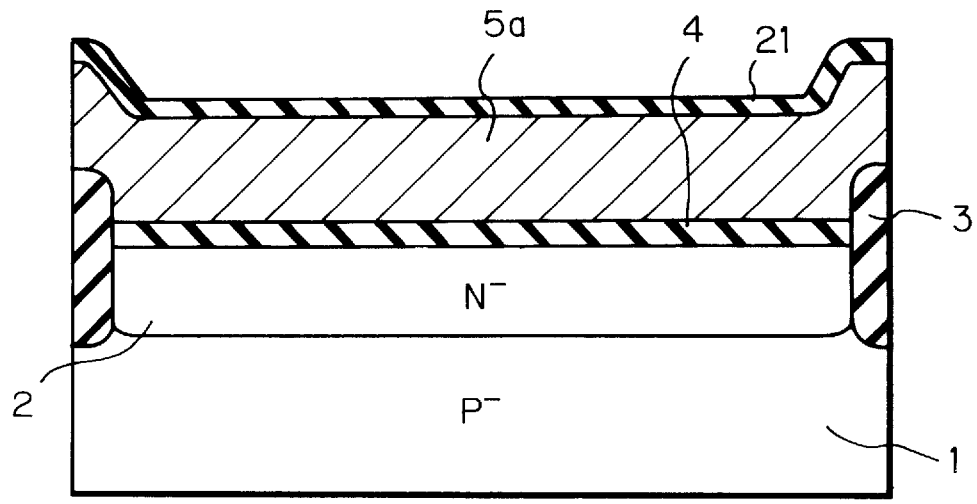
FIGS. 8A through 8E are cross-sectional views for showing a modification of the first embodiment of the method as illustrated in FIGS. 5A through 5D.

First, referring to FIG. 8A, an $N^-$-type well 2 is formed on a $P^-$-type monocrystalline silicon substrate 1. Then, a thick field silicon oxide layer 4 is grown by a LOCOS process to partition an area forming a surface channel type P-channel MOS transistor and other areas for forming a surface channel type N-channel MOS transistor or the like (not shown). Then, an about 2 to 7 nm thick gate silicon oxide layer 4 is grown by thermally oxidizing the $N^-$-type well 2. Then, a polycrystalline silicon layer 5a is deposited by a CVD process. Then, an about 20 nm thick nitrogen including layer 21 is deposited on the entire surface by a CVD process. The nitrogen including silicon layer 21 is made of silicon nitride, silicon oxidonitride, boron nitride, or silicon nitride/silicon oxide.

Figure 8B:
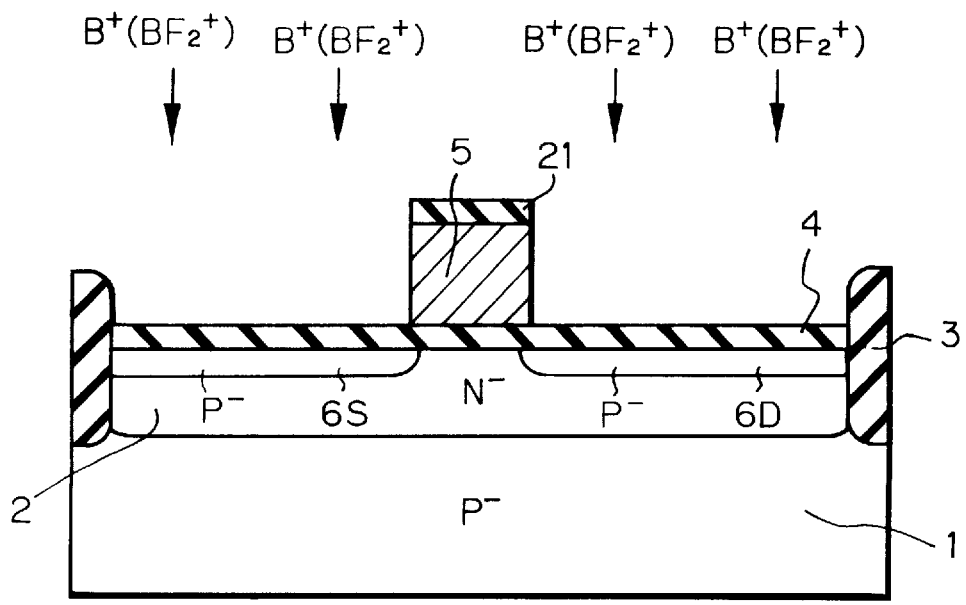

Next, referring to FIG. 8B, the polycrystalline silicon layer 5a as well as the nitrogen including layer 21 is patterned by a photolithography process to form a gate electrode 5 whose gate length is less than 0.35 $\mu$m. Then, boron (B) ions or boron fluoride (BF$_2$) ions are implanted into the N-type well 2 to form P$^-$-type impurity regions 6S and 6D which serve as low impurity regions of a LDD structure.

Figure 8C:
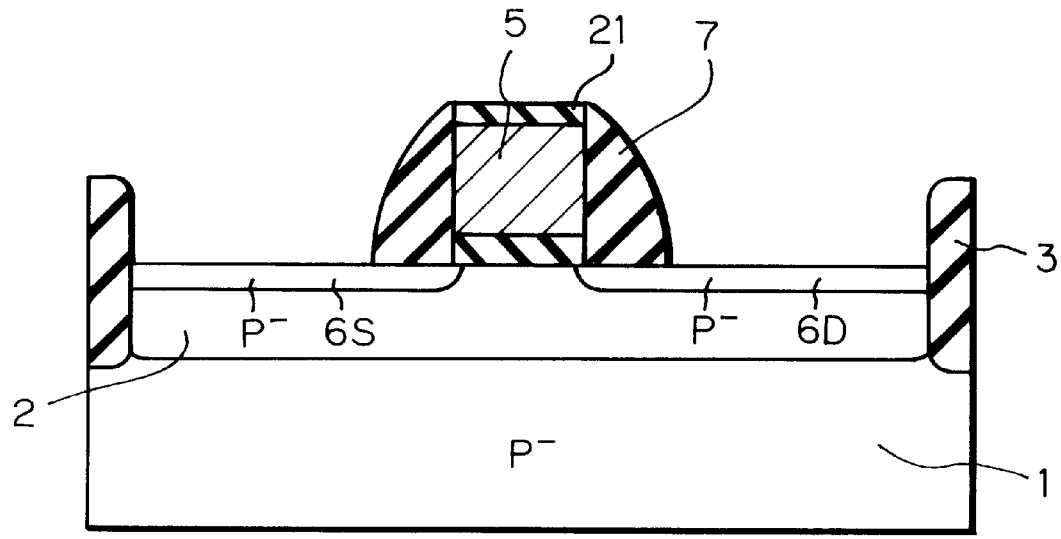

Next, referring to FIG. 8C, in the same way as in FIG. 5B, the gate silicon oxide layer 4 is etched by using the gate electrode 5 as a mask. Then, an about 100 nm thick sidewall silicon oxide layer 7 is formed on the sidewall of the gate electrode 5 and the nitrogen including layer 21.

Figure 8D:
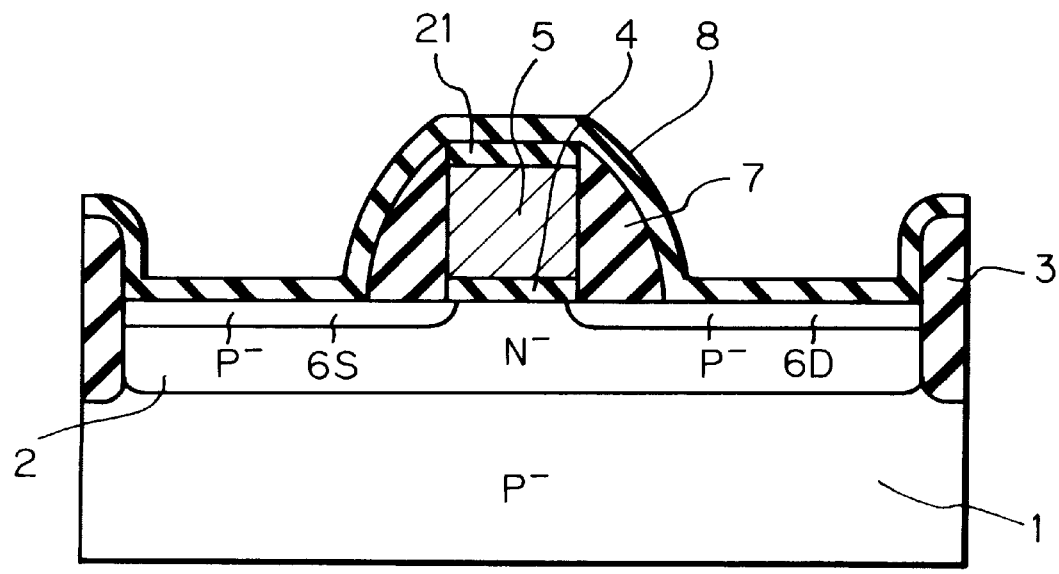
Figure 8E:
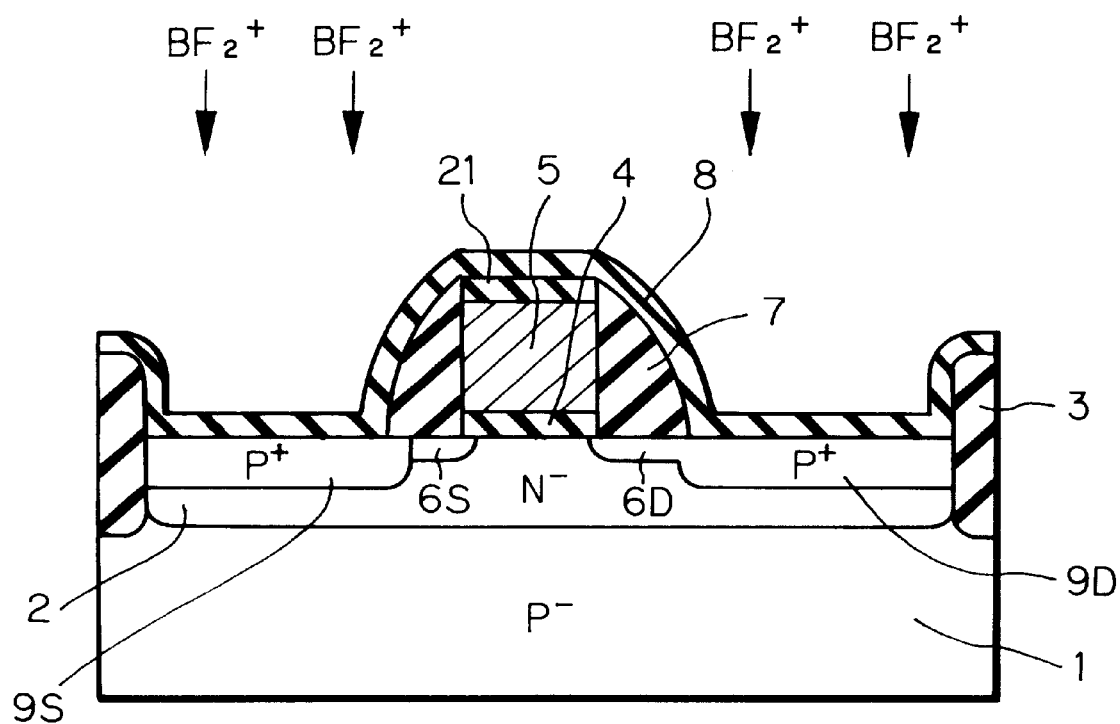

Next, referring to FIG. 8D, a silicon oxide layer 8 is deposited on the entire surface by a CVD process.

Finally, referring to FIG. 8D, in the same way as in FIG. 8D, about 3×10$^{15}$ boron (B) ions or boron fluoride (BF$_2$) ions per cm$^2$ are implanted at an energy of about 30 KeV into the N$^-$-type well 2 by using the nitrogen including layer 21, the gate electrode 5 and the sidewall silicon oxide layer 7 as a mask to form P$^-$-type impurity regions 9S and 9D which serve as high impurity regions of the LDD structure. Then, an annealing operation is carried out at about 900° C. for about 10 minutes to activate the implanted impurities. Then, an insulating layer (not shown) is formed on the entire surface, and contact structures (not shown) are formed therein to complete a surface channel type P-channel MOS transistor.

In the modification of the first embodiment, since the nitrogen including layer 21 is formed on the gate electrode 5, the same effect as that of the first embodiment can be expected.

FIGS. 9A through 9D show a second embodiment of the present invention.

Figure 9A:
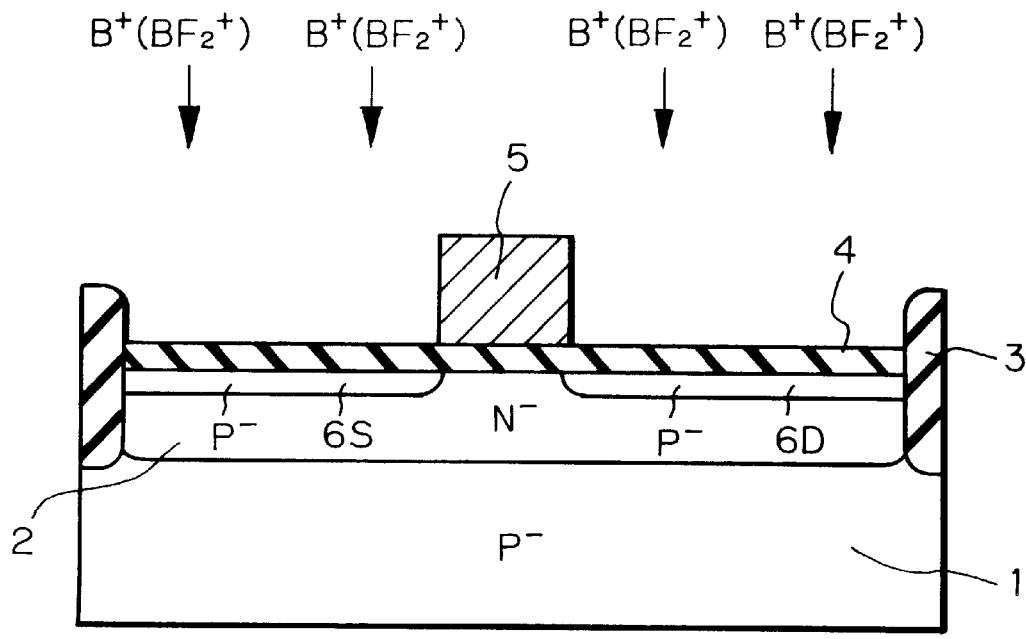
FIGS. 9A through 9D are cross-sectional views for showing a second embodiment of the method for manufacturing a surface channel type P-channel MOS transistor according to the present invention.

First, referring to FIG. 9A, in the same way as in FIG. 1A, an N$^-$-type well 2 is formed on a P$^-$-type monocrystalline silicon substrate 1. Then, a thick field silicon oxide layer 4 is grown by a LOCOS process to partition an area forming a surface channel type P-channel MOS transistor and other areas for forming a surface channel type N-channel MOS transistor or the like (not shown). Then, an about 2 to 7 nm thick gate silicon oxide layer 4 is grown by thermally oxidizing the N$^-$-type well 2. Then, a polycrystalline silicon layer is deposited by a CVD process, and the polycrystalline silicon layer is patterned by a photolithography process to form a gate electrode 5 whose gate length is less than 0.35 μm. Then, boron (B) or boron fluoride (BF$_2$) ions ions are implanted into the N-type well 2 to form P$^-$-type impurity regions 6S and 6D which serve as low impurity regions of an LDD structure.

Figure 9B:
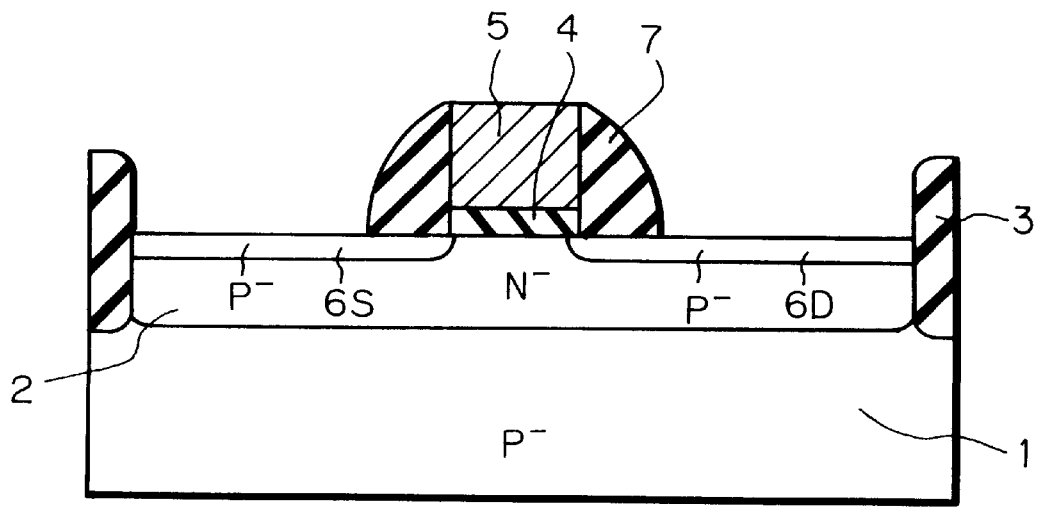

Next, referring to FIG. 9B, in the same way as in FIG. 1B, the gate silicon oxide layer 4 is etched by using the gate electrode 5 as a mask. Then, an about 100 nm thick sidewall silicon oxide layer 7 is formed on the sidewall of the gate electrode 5.

Figure 9C:
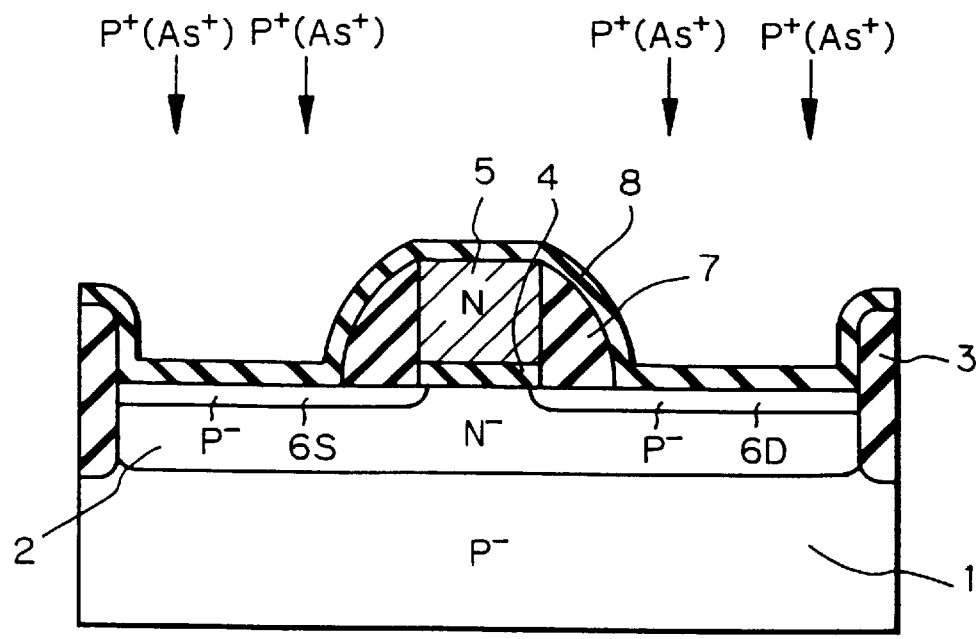

Next, referring to FIG. 9C, in a similar way to that of FIG. 1C, an about 20 nm thick silicon oxide layer is deposited on the entire surface by a CVD process. Then, about 1×10$^{15}$ phosphorus ions or arsenic ions per cm$^2$ are implanted at an energy of about 30 keV.

Figure 9D:
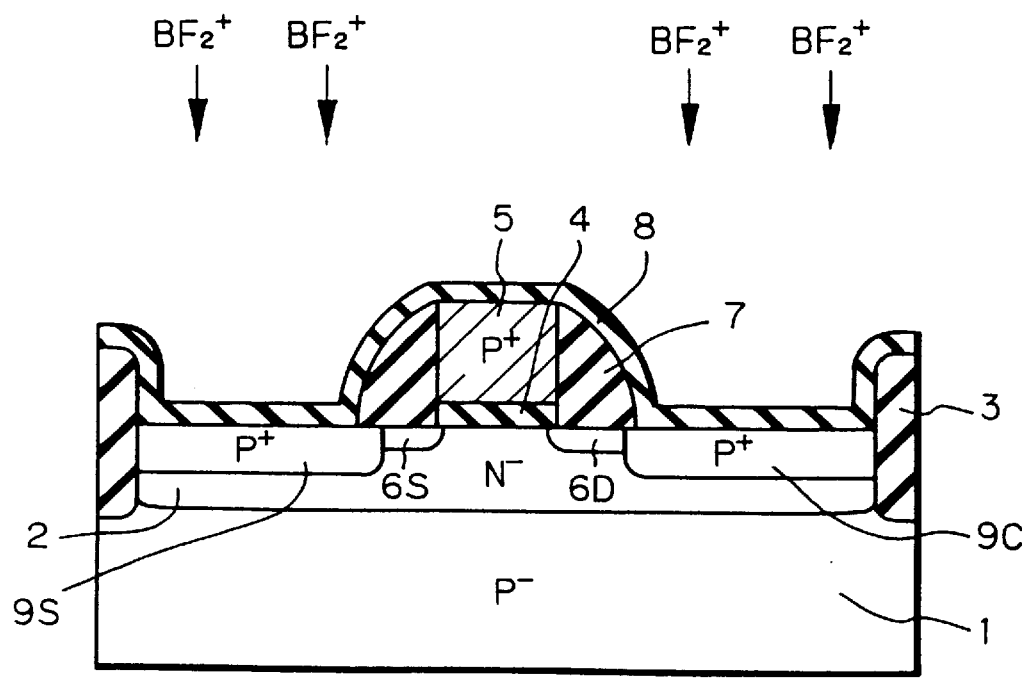

Finally, referring to FIG. 9D, in the same way as in FIG. 1D, about 3×10$^{15}$ boron (B) ions or boron fluoride (BF$_2$) ions per cm$^2$ are implanted at an energy of about 30 KeV into the N$^-$-type well 2 by using the gate electrode 5 and the sidewall silicon oxide layer 7 as a mask to form P$^+$-type impurity regions 9S and 9D which serve as high impurity regions of the LDD structure. Then, an annealing operation is carried out at about 900° C. for about 10 minutes to activate the implanted impurities. Then, an insulating layer (not shown) is formed on the entire surface, and contact structures (not shown) are formed therein to complete a surface channel type P-channel MOS transistor.

In the second embodiment, if the concentration of borons in the gate electrode 5 is about 3×10$^{20}$ cm$^{-3}$, the concentration of phosphorus in the gate electrode 5 is preferably from 10$^{19}$ cm$^{-3}$ to 10$^{20}$ cm$^{-3}$. That is, when the concentration of phosphorus in the gate electrode 5 is too low, the suppression of the boron penetration phenomenon cannot be expected. Contrary to this, when the concentration of phosphorus in the gate electrode 5 is too high, the polarity of phosphorus in the gate electrode affects the electrical properties thereof.

Similarly, if the concentration of borons in the gate electrode 5 is about 3×10$^{20}$ cm$^{-3}$, the concentration of arsenic in the gate electrode 5 is preferably from 5×10$^{19}$ cm$^{-3}$ to 1×10$^{20}$ cm$^{-3}$. That is, when the concentration of arsenic in the gate electrode 5 is too low, the suppression of the boron penetration phenomenon cannot be expected. Contrary to this, when the concentration of arsenic in the gate electrode 5 is too high, the polarity of arsenic in the gate electrode affects the electrical properties thereof.

Thus, the implanted amount of boron ions or boron fluoride ions is twice or more that of phosphorus ions or arsenic ions.

In the second embodiment, phosphorus or arsenic is segregated in grain boundaries of polycrystalline silicon of the gate electrode 5 and the interface between the gate electrode 5 and the gate silicon oxide layer 4, to suppress the thermal diffusion of boron in the gate electrode 5. This suppresses the penetration of boron to the N$^-$-type well 2 (the substrate 1). Also, the distribution of boron in the gate electrode 5 becomes homogeneous. Further, if the ion implantation of phosphorus or arsenic is carried out simultaneously with the ion implantation for a gate electrode of an N-channel MOS transistor, this ion implantation does not increase the number of manufacturing steps, and therefore does not increase the manufacturing cost.

Figure 10:
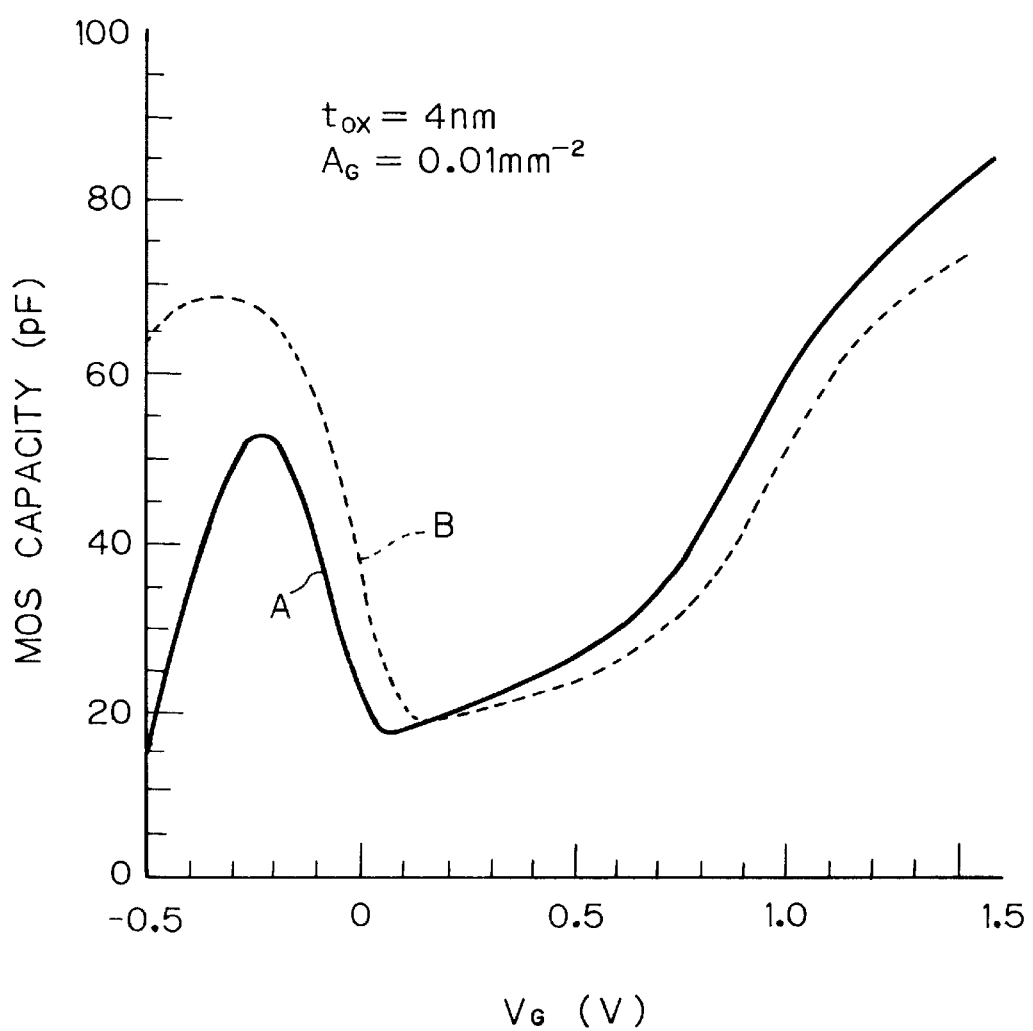
FIG. 10 is a graph showing a MOS capacity of the transistor of FIGS. 9A through 9D.

Thus, as shown in FIG. 10 which corresponds to FIG. 2, even when the temperature of the annealing operation is increased, the boron of the gate electrode 5 hardly penetrates into the N$^-$-type well 2 (the substrate 1), so that the MOS capacity of the transistor hardly fluctuates, which means a small fluctuation of the threshold voltage of the transistor.

FIGS. 11A through 11D show a modification of the second embodiment of the present invention.

First, referring to FIG. 1A, in a similar way to that of FIG. 9A, an N$^-$-type well 2 is formed on a P$^-$-type monocrystalline silicon substrate 1. Then, a thick field silicon oxide layer 4 is grown by a LOCOS process to partition an area forming a surface channel type P-channel MOS transistor and other areas for forming a surface channel type N-channel MOS transistor or the like (not shown). Then, an about 2 to 7 nm thick gate silicon oxide layer 4 is grown by thermally oxidizing the N$^-$-type well 2. Then, a polycrystalline silicon layer 5a is deposited by a CVD process while doping about 1×10$^{20}$ phosphorus ion or arsenic ions per cm$^3$. In this case, after a non-doped polycrystalline silicon layer is formed, phosphorus or arsenic can be doped thereinto by vapor diffusion.

Figure 11A:
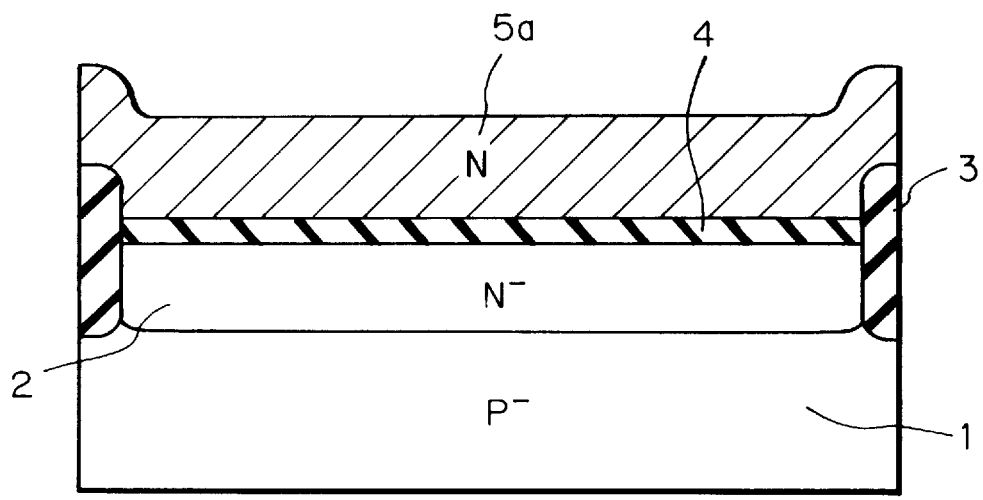
FIGS. 11A through 11D are cross-sectional views for showing a modification of the second embodiment of the method as illustrated in FIGS. 9A through 9D.
Figure 11B:
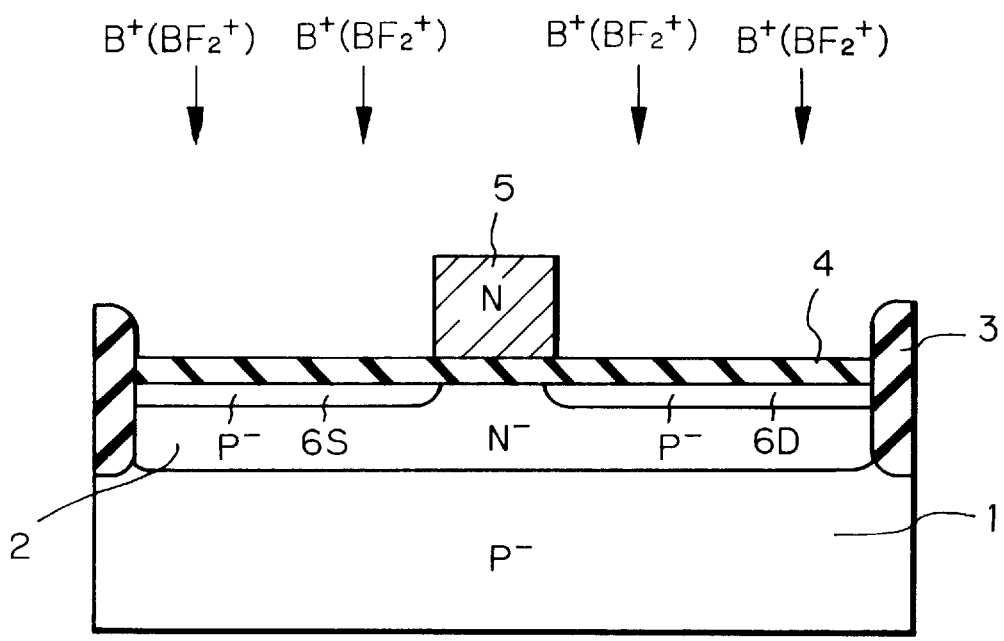
Figure 11C:
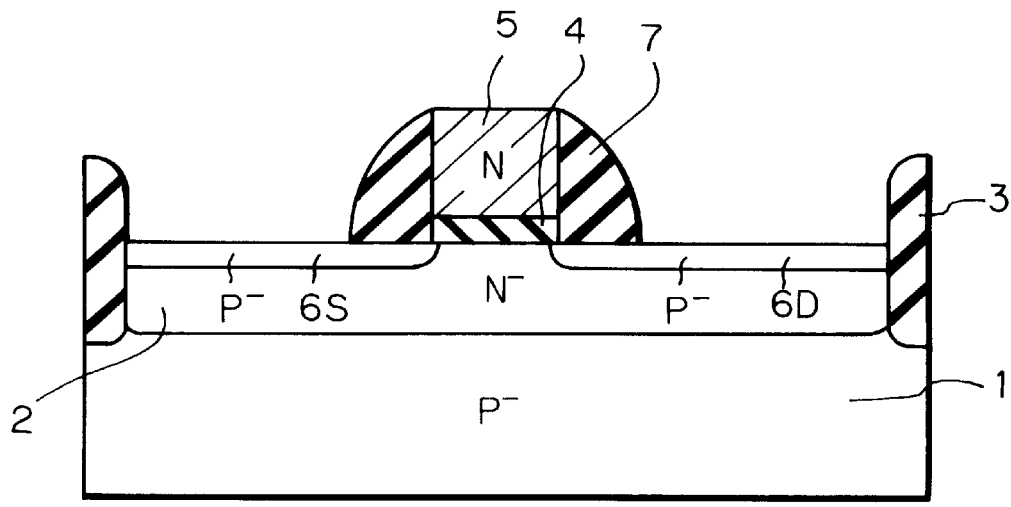

Next, referring to FIG. 11B, the polycrystalline silicon layer is patterned by a photolithography process to form a gate electrode 5 whose gate length is less than 0.35 μm. Then, boron (B) ions or boron fluoride (BF$_2$) ions are implanted into the N-type well 2 to form P$^-$-type impurity regions 6S and 6D which serve as low impurity regions of a LDD structure.

Next, referring to FIG. 1C, in the same way as in FIG. 9B, the gate silicon oxide layer 4 is etched by using the gate electrode 5 as a mask. Then, an about 100 nm thick sidewall silicon oxide layer 7 is formed on the sidewall of the gate electrode 5.

Figure 11D:
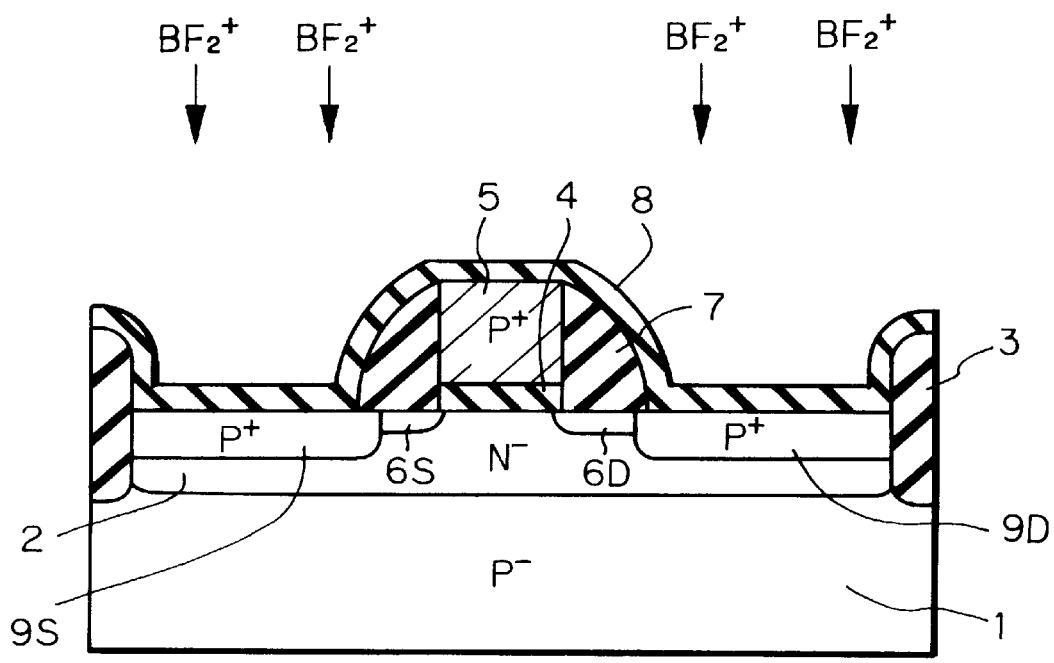

Finally, referring to FIG. 11D, in a similar way to that of FIG. 9D, an about 20 nm thick silicon oxide layer 8 is deposited on the entire surface by a CVD process. Then, about $3\times10^{15}$ boron (B) ions or boron fluoride ($BF_2$) ions per $cm^2$ are implanted at an energy of about 30 KeV into the $N^-$-type well 2 by using the gate electrode 5 and the sidewall silicon oxide layer 7 as a mask to form $P^+$-type impurity regions 9S and 9D which serve as high impurity regions of the LDD structure. Then, an annealing operation is carried out at about 900° C. for about 10 minutes to activate the implanted impurities. Then, an insulating layer (not shown) is formed on the entire surface, and contact structures (not shown) are formed therein to complete a surface channel type P-channel MOS transistor.

In the modification of the second embodiment, the same effect as that of the second embodiment can be expected.

As explained hereinabove, according to the present invention, the boron penetration phenomenon can be suppressed while the thickness of the gate insulating layer can be reduced without increasing the manufacturing cost.

What is claimed is:

1. A method for manufacturing a surface channel type P-channel MOS transistor, comprising the steps of:

forming a gate insulating layer on a semiconductor substrate;

forming a gate electrode on said gate insulating layer;

forming a nitrogen including layer on said gate electrode; and implanting P-type impurities into said gate electrode via said nitrogen including layer, so that nitrogen of the nitrogen including layer is knocked into said gate electrode and said semiconductor substrate.

2. A method of manufacturing a surface channel type P-channel MOS transistor, comprising the steps of:

forming a gate insulating layer on a semiconductor substrate;

forming a polycrystalline silicon layer on said gate insulating layer;

forming a nitrogen including layer on said polycrystalline silicon layer;

patterning said nitrogen including layer and said polycrystalline silicon layer to form a gate electrode; and implanting P-type impurities into said gate electrode, nitrogen of said nitrogen including layer being knocked into said polycrystalline silicon layer and semiconductor substrate.

3. A method for manufacturing a surface channel type P-channel MOS transistor, comprising the steps of:

forming a gate insulating layer on a semiconductor substrate;

forming a non-doped polycrystalline silicon layer on said gate insulating layer;

doping N-type impurities into said non-doped polycrystalline silicon layer by vapor diffusion in order to convert said non-doped polycrystalline silicon layer into an N-type impurity doped polycrystalline silicon layer;

patterning said N-type impurity doped polycrystalline silicon layer to form a gate electrode; and implanting P-type impurities into said gate electrode, a concentration of said P-type impurities into said gate electrode being higher than a concentration of said N-type impurities in said gate electrode.

* * * * *